United States Patent
Kwon

(10) Patent No.: US 11,997,905 B2
(45) Date of Patent: May 28, 2024

(54) OLED MASK WITH END PORTIONED CORNERS

(71) Applicant: Samsung Display Co., Ltd., Yongin-si (KR)

(72) Inventor: Oh-Seob Kwon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/694,613

(22) Filed: Mar. 14, 2022

(65) Prior Publication Data

US 2022/0352260 A1  Nov. 3, 2022

Related U.S. Application Data

(60) Division of application No. 15/284,210, filed on Oct. 3, 2016, now Pat. No. 11,309,356, which is a
(Continued)

(30) Foreign Application Priority Data

Apr. 25, 2013  (KR) .................. 10-2013-0046362

(51) Int. Cl.
*H01L 27/32* (2006.01)
*H01L 51/52* (2006.01)
(Continued)

(52) U.S. Cl.
CPC ......... *H10K 59/352* (2023.02); *H10K 50/805* (2023.02); *H10K 50/813* (2023.02);
(Continued)

(58) Field of Classification Search
CPC .................................................. H01L 27/3216
See application file for complete search history.

(56) References Cited

U.S. PATENT DOCUMENTS 7,505,053 B2 *  3/2009  Brown Elliott .......... G09G 3/20
                                                          345/694
7,819,717 B2   10/2010  Hosoda et al.
(Continued)

FOREIGN PATENT DOCUMENTS

CN    101047202    10/2007
JP    2006-309182  11/2006
(Continued)

OTHER PUBLICATIONS

European Search Report dated Jan. 7, 2015 by EPO in connection with European Patent Application No. 14165873.2 which also claims Korean Patent Application No. 10-2013-0046362 as its priority document was cited by Applicant dated Mar. 9, 2015.
(Continued)

*Primary Examiner* — Peter Bradford
(74) *Attorney, Agent, or Firm* — Lewis Roca Rothgerber Christie LLP

(57) ABSTRACT

An organic light emitting diode display including a first electrode, a pixel defining layer positioned on the first electrode and including a first opening having a first polygonal shape opening the first electrode, and a first organic emission layer positioned on the pixel defining layer through the first electrode corresponding to the first opening and including a first chamfer adjacent to a corner of the first opening.

16 Claims, 9 Drawing Sheets

Related U.S. Application Data continuation of application No. 14/169,829, filed on Jan. 31, 2014, now Pat. No. 9,484,391.

(51) Int. Cl.
| | |
|---|---|
| *H10K 50/805* | (2023.01) |
| *H10K 50/813* | (2023.01) |
| *H10K 59/121* | (2023.01) |
| *H10K 59/122* | (2023.01) |
| *H10K 59/35* | (2023.01) |
| *H10K 71/00* | (2023.01) |
| *H10K 71/16* | (2023.01) |
| *H10K 50/13* | (2023.01) |

(52) U.S. Cl.
CPC ......... *H10K 59/121* (2023.02); *H10K 59/122* (2023.02); *H10K 59/35* (2023.02); *H10K 59/353* (2023.02); *H10K 71/00* (2023.02); *H10K 71/166* (2023.02); *H10K 50/13* (2023.02)

(56) References Cited

U.S. PATENT DOCUMENTS

| | | |
|---|---|---|
| 8,916,876 B2 | 12/2014 | Jeon et al. |
| 2001/0035393 A1 | 11/2001 | Lu et al. |
| 2002/0154347 A1 | 10/2002 | Funakoshi et al. |
| 2004/0061710 A1 | 4/2004 | Messing et al. |
| 2004/0201558 A1 | 10/2004 | Arnold et al. |
| 2004/0252088 A1 | 12/2004 | Kawachi et al. |
| 2006/0274090 A1 | 12/2006 | Koyama et al. |
| 2009/0109172 A1 | 4/2009 | Lee et al. |
| 2009/0121983 A1 | 5/2009 | Sung et al. |
| 2009/0195144 A1 | 8/2009 | Kitabayashi |
| 2009/0309109 A1 | 12/2009 | Chang et al. |
| 2009/0322215 A1 | 12/2009 | Sung et al. |
| 2011/0108859 A1 | 5/2011 | Oosako |
| 2011/0291549 A1 | 12/2011 | Kim et al. |
| 2012/0049726 A1 | 3/2012 | Yoo et al. |
| 2012/0056531 A1* | 3/2012 | Park .................... G09G 3/3233 313/506 |
| 2012/0138904 A1* | 6/2012 | Shimizu ................. H10K 50/11 438/35 |
| 2012/0161141 A1 | 6/2012 | Jeon et al. |
| 2012/0313844 A1 | 12/2012 | Im et al. |
| 2013/0002118 A1 | 1/2013 | Ko |
| 2013/0037827 A1 | 2/2013 | Levermore et al. |
| 2013/0057521 A1 | 3/2013 | Kim |
| 2014/0077189 A1 | 3/2014 | Kugler et al. |
| 2014/0183461 A1 | 7/2014 | Kim et al. |

FOREIGN PATENT DOCUMENTS

| | | | |
|---|---|---|---|
| JP | 2010-095744 A | | 4/2010 |
| JP | 2010129345 A | * | 6/2010 |
| KR | 1020060108152 A | | 10/2006 |
| KR | 1020100072265 A | | 6/2010 |
| KR | 10-2012-0022967 | | 3/2012 |
| KR | 10-2012-0072950 | | 7/2012 |
| KR | 10-2012-0073704 | | 7/2012 |
| TW | 200915920 | | 4/2009 |
| TW | 201301504 | | 1/2013 |

OTHER PUBLICATIONS

Grant of Patent dated Mar. 15, 2019, issued in the Korean Patent Application No. 10-2014-0067936.
Non-Final Office Action dated May 2, 2018, in U.S. Appl. No. 15/284,210.
Final Office Action dated Sep. 10, 2018, in U.S. Appl. No. 15/284,210.
Non-Final Office Action dated Jan. 28, 2019, in U.S. Appl. No. 15/284,210.
Final Office Action dated Aug. 7, 2019, in U.S. Appl. No. 15/284,210.
Non-Final Office Action dated Dec. 31, 2019, in U.S. Appl. No. 15/284,210.
Final Office Action dated Jun. 22, 2020, in U.S. Appl. No. 15/284,210.
Non-Final Office Action dated Feb. 1, 2021, in U.S. Appl. No. 15/284,210.
Final Office Action dated Aug. 5, 2021, in U.S. Appl. No. 15/284,210.
Notice of Allowance dated Dec. 14, 2021, in U.S. Appl. No. 15/284,210.

* cited by examiner

OLED MASK WITH END PORTIONED CORNERS

CROSS-REFERENCE TO RELATED APPLICATION

This application is a Divisional of U.S. patent application Ser. No. 15/284,210, filed on Oct. 3, 2016, which is a Continuation of U.S. patent application Ser. No. 14/169,829, filed on Jan. 31, 2014, issued as U.S. Pat. No. 9,484,391, which claims priority from and the benefit of Korean Patent Application No. 10-2013-0046362, filed on Apr. 25, 2013, which are hereby incorporated by reference for all purposes as if fully set forth herein.

BACKGROUND

Embodiments of the present invention relate generally to an organic light emitting diode display and a mask unit, and more particularly, to an organic light emitting diode display including a plurality of organic emission layers emitting different colored light and a mask unit used when the organic emission layer is deposited.

A display device is a device displaying an image, and recently, an organic light emitting diode display has received attention.

Since the organic light emitting diode display has a self-emission characteristic and does not require a separate light source unlike a liquid crystal display device, it is possible to reduce a thickness and a weight thereof. Further, the organic light emitting diode display has high-quality characteristics such as low power consumption, high luminance, and a high response speed.

In general, the organic light emitting diode display includes an anode, a pixel defining layer including an opening defining an area and a shape of a pixel by opening the anode, an organic emission layer positioned on the anode corresponding to the opening, and a cathode positioned on the organic emission layer.

Here, the pixel means a minimum unit displaying an image, and is a portion where the organic emission layer substantially emits light.

An organic emission layer configuring a pixel of an organic light emitting diode display in the related art is deposited by using a mask such as a fine metal mask (FMM).

Recently, an organic light emitting diode display implementing high resolution in a limited display area has been developed.

However, in the high resolution organic light emitting diode display, since a size of a pixel is very small and thus a size of a pattern formed at the mask is very small according to the opening of the pixel defining layer, it is difficult to form a pattern at the mask, and as a result, manufacturing yield of the mask deteriorates.

Further, in the high resolution organic light emitting diode display, a distance between adjacent pixels becomes decreased, and as a result, when the organic emission layer is deposited on an opening through a pattern of the mask, an edge of the deposited organic emission layer intrudes into the other opening and two or more organic emission layers are deposited in the other opening, and thus there is a problem in that colors of light emitted by a pixel corresponding to the other opening are mixed.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode display having advantages of preventing colors of light emitted by one pixel from being mixed, even though the organic light emitting diode display is implemented at high resolution in a limited display area.

Further, the present invention has been made in an effort to provide a mask unit having advantages of improving manufacturing yield, even though the mask unit is used when a high resolution organic light emitting diode display is manufactured in a limited display area.

An embodiment provides an organic light emitting diode display including a first electrode, a pixel defining layer positioned on the first electrode and including a first opening having a first polygonal shape opening the first electrode, and a first organic emission layer positioned on the pixel defining layer through the first electrode corresponding to the first opening and including a first chamfer adjacent to a corner of the first opening.

A first distance between one edge of the first opening disposed on a first virtual straight line traversing the first opening and one edge of the first organic emission layer may be different from a second distance between the other edge of the first opening disposed on a second virtual straight line which is parallel to the first straight line to traverse the first opening and the other edge of the first organic emission layer.

The entire edge of the first organic emission layer may include four first chamfers which are spaced apart from each other and four first connection portions connecting ends of the first chamfers.

Each of the four first connection portions may be curved one time or more and extended.

A central point of the first opening may be positioned at a first vertex of a virtual triangle, the organic light emitting diode display may further include a second electrode which is spaced apart from the first electrode and of which a central area is positioned at a second vertex of the virtual triangle, the pixel defining layer further may include a second opening which has a second polygonal shape opening the second electrode and of which a central point is positioned at the second vertex, and the organic light emitting diode display may further include a second organic emission layer positioned on the pixel defining layer through the second electrode corresponding to the second opening and including a second chamfer adjacent to a corner of the second opening.

The entire edge of the second organic emission layer may include four second chamfers which are spaced apart from each other and four second connection portions connecting ends of the second chamfers.

Each of the four second connection portions may be curved one time or more and extended.

The first chamfer of the first organic emission layer may be overlapped with the second chamfer of the second organic emission layer.

One of the first organic emission layer and the second organic emission layer may emit red light, and the other may emit blue light.

The organic light emitting diode display may further include a third electrode which is spaced apart from the first electrode and the second electrode and of which a central area is positioned at a third vertex of the virtual triangle, the pixel defining layer further may include a third opening which has a third polygonal shape opening the third electrode and of which a central point is positioned at the third vertex, and the organic light emitting diode display may further include a third organic emission layer positioned on the pixel defining layer through the third electrode corresponding to the third opening.

The entire edge of the third organic emission layer may have an octagonal shape.

A part of the entire edge of the third organic emission layer which is spaced apart from the first chamfer and the second chamfer, respectively may be overlapped with each edge of the first organic emission layer and the second organic emission layer.

One of the first organic emission layer, the second organic emission layer, and the third organic emission layer may emit red light, another may emit blue light, and the other may emit green light.

The virtual triangle may be an isosceles triangle in which a length of a first side connecting the first vertex and the third vertex is the same as a length of a second side connecting the second vertex and the third vertex.

The first polygon may be a quadrangle, the second polygon may be a hexagon, and the third polygon may be an octagon.

Another embodiment provides a mask unit disposed on a substrate including a first electrode and a pixel defining layer positioned on the first electrode and including a first opening having a first polygonal shape opening the first electrode. The mask unit includes a first mask through-formed to correspond to the pixel defining layer through the first electrode corresponding to the first opening and includes a first mask pattern portion including a first mask chamfer corresponding to a corner of the first opening.

The entire edge of the first mask pattern portion may include four first mask chamfers which are spaced apart from each other and four first mask connection portions connecting ends of the first mask chamfers.

Each of the four first mask connection portions may be curved one time or more and extended.

A central point of the first opening may be positioned at a first vertex of a virtual triangle, and the substrate may further include a second electrode which is spaced apart from the first electrode and of which a central area is positioned at a second vertex of the virtual triangle, and the pixel defining layer may further include a second opening which has a second polygonal shape opening the second electrode and of which a central point is positioned at the second vertex, and the mask unit may further include a second mask through-formed to correspond to the pixel defining layer through the second electrode corresponding to the second opening and including a second mask pattern portion including a second mask chamfer adjacent to a corner of the second opening.

The entire edge of the second mask pattern portion may include four second mask chamfers which are spaced apart from each other and four second mask connection portions connecting ends of the second mask chamfers.

Each of the four second mask connection portions may be curved one time or more and extended.

The first chamfer of the first organic emission layer formed on the pixel defining layer through the first mask pattern portion may be overlapped with the second mask chamfer of the second mask.

The substrate may further include a third electrode which is spaced apart from the first electrode and the second electrode and of which a central area is positioned at a third vertex of the virtual triangle, and the pixel defining layer may further include a third opening which has a third polygonal shape opening the third electrode and of which a central point is positioned at the third vertex, and the mask unit may further include a third mask including a third mask pattern portion through-formed to correspond to the pixel defining layer through the third electrode corresponding to the third opening.

The entire edge of the third mask pattern portion may have an octagonal shape.

A part of the entire edge of the third mask pattern portion which is spaced apart from the first chamfer of the first organic emission layer formed on the pixel defining layer through the first mask pattern portion and the second chamfer of the second organic emission layer formed on the pixel defining layer through the second mask pattern portion may be overlapped with each edge of the first organic emission layer and the second organic emission layer.

Yet another embodiment provides an organic light emitting diode display including a first electrode, a pixel defining layer positioned on the first electrode and including a first opening having a first polygonal shape opening the first electrode, and a first organic emission layer positioned on the pixel defining layer through the first electrode corresponding to the first opening and including a first convex portion adjacent to a corner of the first opening.

A first distance between one edge of the first opening disposed on a first virtual straight line traversing the first opening and one edge of the first organic emission layer may be different from a second distance between the other edge of the first opening disposed on a second virtual straight line which is parallel to the first straight line to traverse the first opening and the other edge of the first organic emission layer.

The entire edge of the first organic emission layer may include four first convex portions which are connected to each other.

A central point of the first opening may be positioned at a first vertex of a virtual triangle, the organic light emitting diode display may further include a second electrode which is spaced apart from the first electrode and of which a central area is positioned at a second vertex of the virtual triangle, and the pixel defining layer may further include a second opening which has a second polygonal shape opening the second electrode and of which a central point is positioned at the second vertex, and the organic light emitting diode display may further include a second organic emission layer positioned on the pixel defining layer through the second electrode corresponding to the second opening and including a second convex portion adjacent to a corner of the second opening.

The entire edge of the second organic emission layer may include four second convex portions which are connected to each other.

The first convex portion of the first organic emission layer may be overlapped with the second convex portion of the second organic emission layer.

One of the first organic emission layer and the second organic emission layer may emit red light, and the other may emit blue light.

The organic light emitting diode display may further include a third electrode which is spaced apart from the first electrode and the second electrode and of which a central area is positioned at a third vertex of the virtual triangle, the pixel defining layer may further include a third opening which has a third polygonal shape opening the third electrode and of which a central point is positioned at the third vertex, and the organic light emitting diode display may further include a third organic emission layer positioned on the pixel defining layer through the third electrode corresponding to the third opening.

The entire edge of the third organic emission layer may have a closed loop shape surrounding the edge of the third opening.

One of the first organic emission layer, the second organic emission layer, and the third organic emission layer may emit red light, another may emit blue light, and the other may emit green light.

The virtual triangle may be an isosceles triangle in which a length of a first side connecting the first vertex and the third vertex is the same as a length of a second side connecting the second vertex and the third vertex.

The first polygon may be a quadrangle, the second polygon may be a hexagon, and the third polygon may be an octagon.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
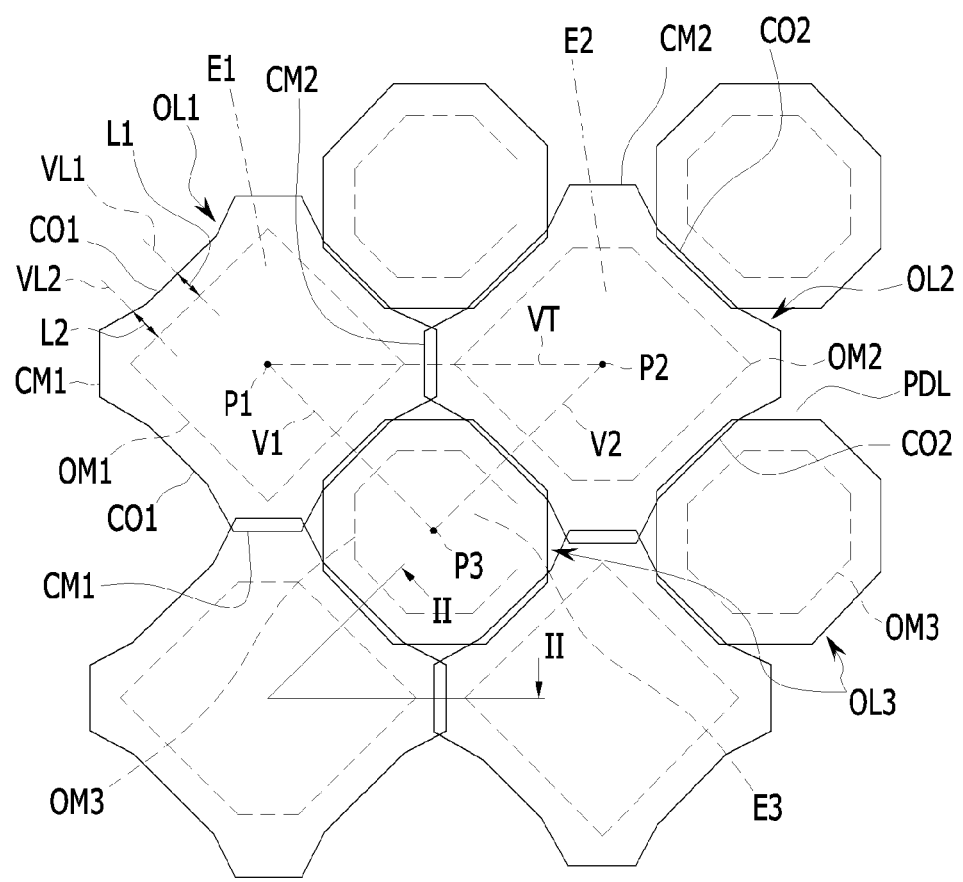
FIG. 1 is a diagram illustrating a partial plane of an organic light emitting diode display constructed as a first embodiment according to the principles of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in the drawings, size and thickness of each element are arbitrarily illustrated for convenience of description, and the present invention is not necessarily limited to those illustrated in the drawings.

Further, in the specification, unless explicitly described to the contrary, the word "comprise" and variations such as "comprises" or "comprising", will be understood to imply the inclusion of stated elements but not the exclusion of any other elements.

Hereinafter, an organic light emitting diode display according to a first embodiment will be described with reference to FIGS. 1 and 2.

FIG. 1 is a diagram illustrating a partial plane of an organic light emitting diode display according to a first embodiment. For convenience of description, FIG. 1 mainly illustrates a first electrode, a pixel defining layer, and an organic emission layer. FIG. 2 is a cross-sectional view taken along line II-II of FIG. 1.

Figure 2:
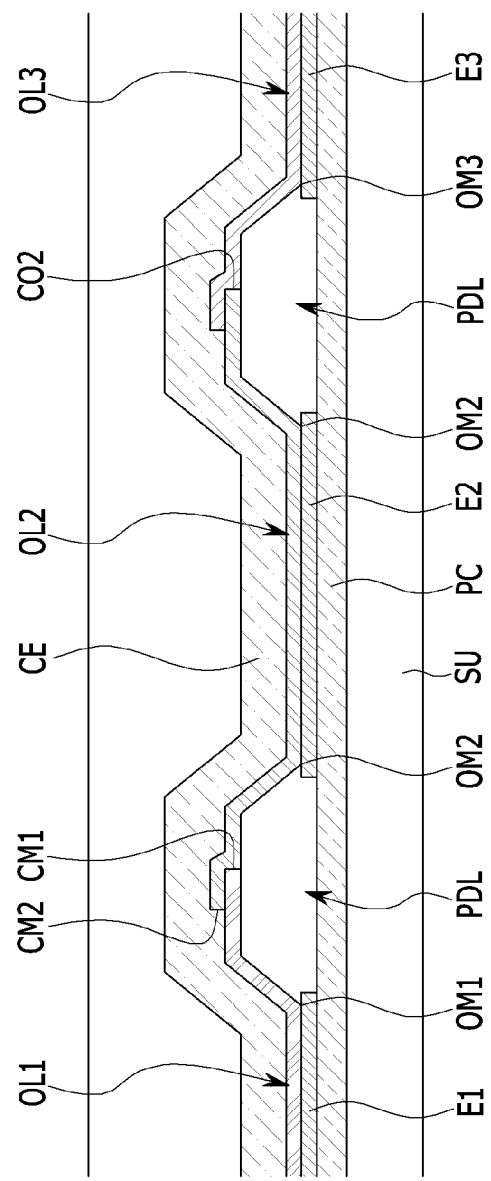
FIG. 2 is a cross-sectional view taken along line II-II of FIG. 1.

As illustrated in FIGS. 1 and 2, an organic light emitting diode display according to the first embodiment includes a substrate SU, a circuit part PC, a first electrode E1, a second electrode E2, a third electrode E3, a pixel defining layer PDL, a first organic emission layer OL1, a second organic emission layer OL2, a third organic emission layer OL3, and a common electrode CE.

The substrate SU is formed by an insulating substrate made of glass, quartz, ceramics, metal, plastic, and the like. Further, in the case where the substrate SU is made of plastic, the organic light emitting diode display may have a flexible characteristic, and a stretchable or rollable characteristic.

The circuit part PC is positioned on the substrate SU, and may include wires including one or more scan lines, data lines, driving power lines, common power lines, and the like, and a pixel circuit such as two or more thin film transistors (TFT) connected to the wires to correspond to one pixel and one or more capacitors, and the like. The circuit part PC may be formed to have various known structures.

The first electrode E1 is positioned on the circuit part PC, and connected with the thin film transistor (TFT) of the circuit part PC. A central area of the first electrode E1 is positioned at a first vertex P1 of a virtual triangle VT. Here, the virtual triangle VT is an isosceles triangle in which central areas of the first electrode E1, the second electrode E2, and the third electrode E3 which are adjacent to each other are connected to each other. In detail, a length of a first side V1 connecting the first vertex P1 and the third vertex P3 of the virtual triangle VT is the same as a length of a second side V2 connecting the second vertex P2 and the third vertex P3.

The first electrode E1 may have various polygonal shapes, and the central area of the first electrode E1 is opened by a first opening OM1 of the pixel defining layer PDL.

The second electrode E2 is positioned on the circuit part PC, and spaced apart from the first electrode E1. The second electrode E2 is connected with the thin film transistor (TFT) of the circuit part PC. A central area of the second electrode E2 is positioned at the second vertex P2 of the virtual triangle VT. The second electrode E2 may have various polygonal shapes, and the central area of the second electrode E2 is opened by a second opening OM2 of the pixel defining layer PDL.

The third electrode E3 is spaced apart from the first electrode E1 and the second electrode E2 and positioned on the circuit part PC. The third electrode E3 is connected with the thin film transistor (TFT) of the circuit part PC. A central area of the third electrode E3 is positioned at the third vertex P3 of the virtual triangle VT. The third electrode E3 may have various polygonal shapes, and the central area of the third electrode E3 is opened by a third opening OM3 of the pixel defining layer PDL.

The first electrode E1 and the second electrode E2 are disposed on a virtual square with the third electrode E3 as the center, and the first electrode E1 and the second electrode E2 surround the third electrode E3 with the third electrode E3 as the center. Each of the first electrode E1, the second electrode E2, and the third electrode E3 may be an anode functioning as a hole injection electrode or a cathode. The first electrode E1, the second electrode E2, and the third electrode E3 may be formed by light transmitting electrodes or light reflecting electrodes.

The pixel defining layer PDL is positioned on the first electrode E1, the second electrode E2, and the third electrode E3, respectively, and covers edges of the first electrode E1, the second electrode E2, and the third electrode E3. The pixel defining layer PDL includes the first opening OM1, the second opening OM2, and the third opening OM3.

The first opening OM1 opens the first electrode E1 and has a first polygonal shape which is a quadrangle. The first opening OM1 is spaced apart from the third opening OM3 and the second opening OM2, and a central point thereof is positioned at the first vertex P1 of the virtual triangle VT. The first opening OM1 has a larger area than the adjacent third opening OM3 and has a smaller area than the adjacent second opening OM2. The first opening OM1 has a quadrangular shape among the polygonal shapes, but is not limited thereto and may have polygonal shapes such as a triangle, a pentagon, a hexagon, a heptagon, and an octagon. A plurality of first openings OM1 is included, and the plurality of first openings OM1 has the same quadrangular shape. The plurality of first openings OM1 is spaced apart from each other with the third opening OM3 therebetween. The first organic emission layer OL1 emitting red light is positioned on the first electrode E1 opened by the first opening OM1. Alternatively, an organic emission layer emitting various colored light such as blue, green, or white may be positioned on the first electrode E1 opened by the first opening OM1.

The second opening OM2 opens the second electrode E2 and has a second polygonal shape which is a hexagon. The second opening OM2 is spaced apart from the first opening OM1 and the third opening OM3, respectively, and a central point thereof is positioned at the second vertex P2 of the virtual triangle VT. The second opening OM2 has a larger area than the adjacent third opening OM3 and first opening OM1, respectively. The second opening OM2 has a hexagonal shape among the polygonal shapes, but is not limited thereto and may have polygonal shapes such as a triangle, a quadrangle, a pentagon, a heptagon, and an octagon. A plurality of second openings OM2, and the plurality of second openings OM2 has the same hexagonal shape. The plurality of second openings OM2 is spaced apart from each other with the third opening OM3 therebetween. The second organic emission layer OL2 emitting blue light is positioned on the second electrode E2 opened by the second opening OM2. Alternatively, an organic emission layer emitting various colored light such as red, green, or white may be positioned on the second electrode E2 opened by the second opening OM2.

The third opening OM3 opens the third electrode E3 and has a third polygonal shape which is an octagon. The third opening OM3 is spaced apart from the first opening OM1 and the second opening OM2, respectively, and a central point thereof is positioned at the third vertex P3 of the virtual triangle VT. The third opening OM3 has a smaller area than the adjacent second opening OM2 and first opening OM1, respectively. The third opening OM3 has an octagonal shape among the polygonal shapes, but is not limited there to and may have polygonal shapes such as a triangle, a quadrangle, a pentagon, a hexagon, and a heptagon. A plurality of third openings OM3 is included, and adjacent third openings OM3 among the plurality of third openings OM3 have octagonal shapes which are symmetrical to each other. Meanwhile, the plurality of third openings OM3 may have the same octagonal shape. The third organic emission layer OL3 emitting green light is positioned on the third electrode E3 opened by the third opening OM3. Alternatively, an organic emission layer emitting various colored light such as blue, red, or white may be positioned on the third electrode E3 opened by the third opening OM3.

Meanwhile, the center of the third opening OM3 is positioned at the central point of the virtual square, and centers of the first opening OM1 and the second opening OM2 surrounding the third opening OM3 along the virtual square may be positioned at adjacent vertexes of the virtual square, respectively.

The first organic emission layer OL1 is positioned on the pixel defining layer PDL through the first electrode E1 corresponding to the first opening OM1. The first organic emission layer OL1 includes a first chamfer CM1 adjacent to a corner of the first opening OM1 which is a quadrangle. The first chamfer CM1 may be an edge of the first organic emission layer OL1 that intersects a straight line crossing the central point of the first opening OM1 and a vertex, for example, the corner, of the first opening OM1, wherein the vertex or the corner of the first opening OM1 is disposed between the first chamfer CM1 and the central point of the first opening OM1.

The entire edge of the first organic emission layer OL1 has a hexadecagonal shape, and includes four first chamfers CM1 and four first connection portions CO1 connecting ends of the first chamfers CM1. Each of the four first connection portions CO1 is curved twice and extended to connect the adjacent first chamfers CM1. Alternatively, the first connection portions CO1 are curved once or three times or more and extended or extended in a straight line to connect the adjacent first chamfers CM1.

The entire edge of the first organic emission layer OL1 includes four first chamfers CM1 and four first connection portions CO1, and as a result, a distance L1 between one edge of the first opening OM1 disposed on a first virtual straight line VL1 traversing the first opening OM1 and one edge of the first organic emission layer OL1 is different from a second distance L2 between the other edge of the first opening OM1 disposed on a second virtual straight line VL2 which is parallel to the first straight line VL1 to traverse the first opening OM1 and the other edge of the first organic emission layer OL1. In other words, the same first connection portion CO1 has at least two points that have different distances from a same edge, which is disposed between the same first connection portion CO1 and a central point of the first opening OM1, of the first opening OM1. More specifically, the second distance L2 close to the first chamfer CM1 adjacent to the corner of the first opening OM1 is longer than the first distance L1.

The first organic emission layer OL1 includes an organic material emitting red light, and a portion which is positioned at the first opening OM1 and contacts the first electrode E1 emits red light. That is, the first organic emission layer OL1 has a quadrangular shape which is the first polygonal shape of the first opening OM1 and emits the red light.

Alternatively, the first organic emission layer OL1 may include an organic material emitting blue, green, or white light, and in this case, the portion which is positioned at the first opening OM1 and contacts the first electrode E1 emits blue, green, or white light.

The second organic emission layer OL2 is positioned on the pixel defining layer PDL through the second electrode E2 corresponding to the second opening OM2. The second organic emission layer OL2 includes a second chamfer CM2 adjacent to a corner of the second opening OM2 which is a hexagon.

The entire edge of the second organic emission layer OL2 has a hexadecagonal shape, and includes four second chamfers CM2 and four second connection portions CO2 connecting ends of the second chamfers CM2. Each of the four second connection portions CO2 is curved twice and extended to connect the adjacent second chamfers CM2.

Alternatively, the second connection portions CO2 are curved once or three times or more and extended or extended in a straight line to connect the adjacent second chamfers CM2.

The second chamfer CM2 of the second organic emission layer OL2 is overlapped with the first chamfer CM1 of the first organic emission layer OL1 at a top portion of the pixel defining layer PDL. Even though the second chamfer CM2 of the second organic emission layer OL2 is overlapped with the first chamfer CM1 of the first organic emission layer OL1, since the first electrode E1 or the second electrode E2 is not positioned at the top portion of the pixel defining layer PDL, the first chamfer CM1 of the first organic emission layer OL1 and the second chamfer CM2 of the second organic emission layer OL2 which are the overlapped portions do not emit light.

The second organic emission layer OL2 includes an organic material emitting blue light, and a portion which is positioned at the second opening OM2 and contacts the second electrode E2 emits blue light. That is, the second organic emission layer OL2 has a hexagonal shape which is the second polygonal shape of the second opening OM2 and emits the blue light.

Alternatively, the second organic emission layer OL2 may include an organic material emitting red, green, or white light, and in this case, the portion which is positioned at the second opening OM2 and contacts the second electrode E2 emits red, green, or white light.

The third organic emission layer OL3 is positioned on the pixel defining layer PDL through the third electrode E3 corresponding to the third opening OM3. The entire edge of the third organic emission layer OL3 has an octagonal shape having a larger area than the third opening OM3.

The partial edge spaced apart from the first chamfer CM1 and the second chamfer CM2 among the entire edges of the third organic emission layer OL3 is overlapped with the edges of the first organic emission layer OL1 and the second organic emission layer OL2 at a top portion of the pixel defining layer PDL, respectively. Even though the partial edge of the third organic emission layer OL3 is overlapped with the edges of the first organic emission layer OL1 and the second organic emission layer OL2, respectively, since the first electrode E1, the second electrode E2, or the third electrode E3 is not positioned at the top portion of the pixel defining layer PDL, the partial edges of the first organic emission layer OL1, the second organic emission layer OL2, and the third organic emission layer OL3 which are the overlapped portions do not emit light.

The third organic emission layer OL3 includes an organic material emitting green light, and a portion which is positioned at the third opening OM3 and contacts the third electrode E3 emits green light. That is, the third organic emission layer OL3 has an octagonal shape which is the third polygonal shape of the third opening OM3 and emits the green light.

Alternatively, the third organic emission layer OL3 may include an organic material emitting red, blue, or white light, and in this case, the portion which is positioned at the third opening OM3 and contacts the third electrode E3 emits red, blue, or white light.

The common electrodes CE are positioned on the first organic emission layer OL1, the second organic emission layer OL2, and the third organic emission layer OL3 all over the surface of the substrate SU, and each of the common electrodes CE may be a cathode functioning as an electron injection electrode or an anode. The common electrode CE may be formed as a light transmitting electrode or a light reflecting electrode.

As such, the organic light emitting diode display according to the first embodiment is implemented at high resolution in a limited display area, and as a result, distances between the corners of the first opening OM1, the second opening OM2, and the third opening OM3 which are adjacent to each other are decreased and simultaneously, the first organic emission layer OL1 is formed to have a larger area than the first opening OM1. Accordingly, even though the first organic emission layer OL1 is positioned at the top portion of the pixel defining layer PDL, the first organic emission layer OL1 includes the first chamfer CM1 adjacent to the corner of the first opening OM1, and as a result, when the first organic emission layer OL1 is deposited, the first chamfer CM1 which is an outermost edge of the first organic emission layer OL1 is prevented from intruding into the second opening OM2 or the third opening OM3. That is, the organic light emitting diode display, which prevents colors of light emitted from the first opening OM1, the second opening OM2, and the third opening OM3 from being mixed, is provided.

Further, the organic light emitting diode display according to the first embodiment is implemented at high resolution in a limited display area, and as a result, distances between the corners of the first opening OM1, the second opening OM2, and the third opening OM3 which are adjacent to each other are decreased and simultaneously, the second organic emission layer OL2 is formed to have a larger area than the second opening OM2. Accordingly, even though the second organic emission layer OL2 is positioned at the top portion of the pixel defining layer PDL and overlapped with the first chamfer CM1 of the first organic emission layer OL1, the second organic emission layer OL2 includes the second chamfer CM2 adjacent to the corner of the second opening OM2, and as a result, when the second organic emission layer OL2 is deposited, the second chamfer CM2 which is an outermost edge of the second organic emission layer OL2 is prevented from intruding into the first opening OM1 or the third opening OM3. That is, the organic light emitting diode display, which prevents colors of light emitted from the first opening OM1, the second opening OM2, and the third opening OM3 from being mixed, is provided.

Hereinafter, a mask unit according to a second embodiment used when the first organic emission layer, the second organic emission layer, and the third organic emission layer of the organic light emitting diode display according to the first embodiment described above are manufactured will be described with reference to FIGS. 3 through 8.

The mask unit includes a first mask, a second mask, and a third mask used when the first organic emission layer, the second organic emission layer, and the third organic emission layer are manufactured.

Figure 3:
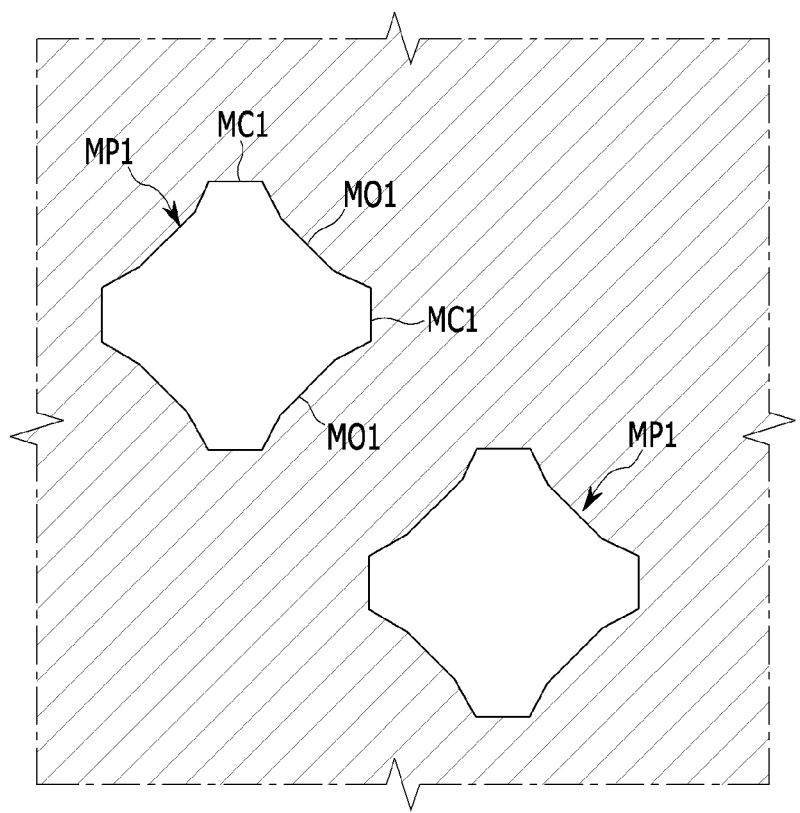
FIG. 3 is a diagram illustrating a partial plane of a first mask of a mask unit constructed as a second embodiment according to the principles of the present invention.
Figure 4:
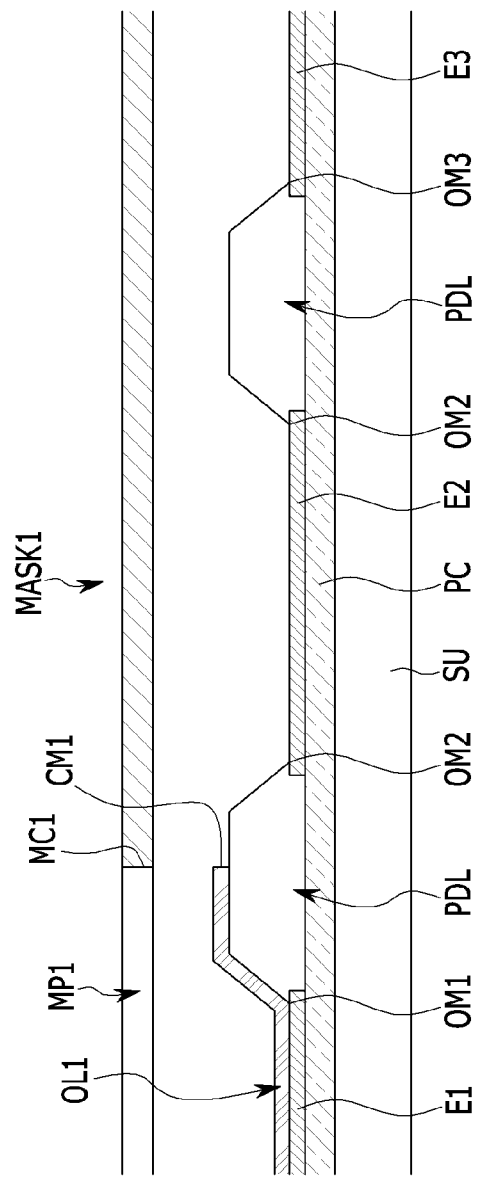
FIG. 4 is a diagram for describing formation of a first organic emission layer using the first mask illustrated in FIG. 3.

FIG. 3 is a diagram illustrating a partial plane of a first mask of a mask unit according to a second embodiment. FIG. 4 is a diagram for describing formation of a first organic emission layer using the first mask illustrated in FIG. 3.

As illustrated in FIGS. 3 and 4, a first mask MASK1 of the mask unit according to the second embodiment is used when depositing the first organic emission layer OL1 and includes a first mask pattern portion MP1. The first mask MASK1 is disposed on the pixel defining layer PDL during a depositing process for forming the first organic emission layer OL1.

The first mask pattern portion MP1 is positioned on the first electrode E1, disposed on the pixel defining layer PDL including the first opening OM1 having a first polygonal shape opening the first electrode E1, and used when the first organic emission layer OL1 is formed. The first mask pattern portion MP1 has a dotted shape, and is through-formed to correspond to the pixel defining layer PDL through the first electrode E1 corresponding to the first opening OM1. The first mask pattern portion MP1 includes a first mask chamfer MC1 corresponding to the corner of the first opening OM1.

The entire edge of the first mask pattern portion MP1 has a hexadecagonal shape corresponding to the entire shape of the first organic emission layer OL1, and includes four first mask chamfers MC1 which are spaced apart from each other and four first mask connection portions MO1 connecting ends of the first mask chamfers MC1. Each of the four first mask connection portions MO1 is curved twice and extended to connect the adjacent first mask chamfers MC1. Alternatively, the first mask connection portions MO1 are curved once or three times or more and extended or extended in a straight line to connect the adjacent first mask chamfers MC1.

The first organic emission layer OL1 is formed on the first electrode E1 through the first mask pattern portion MP1.

Figure 5:
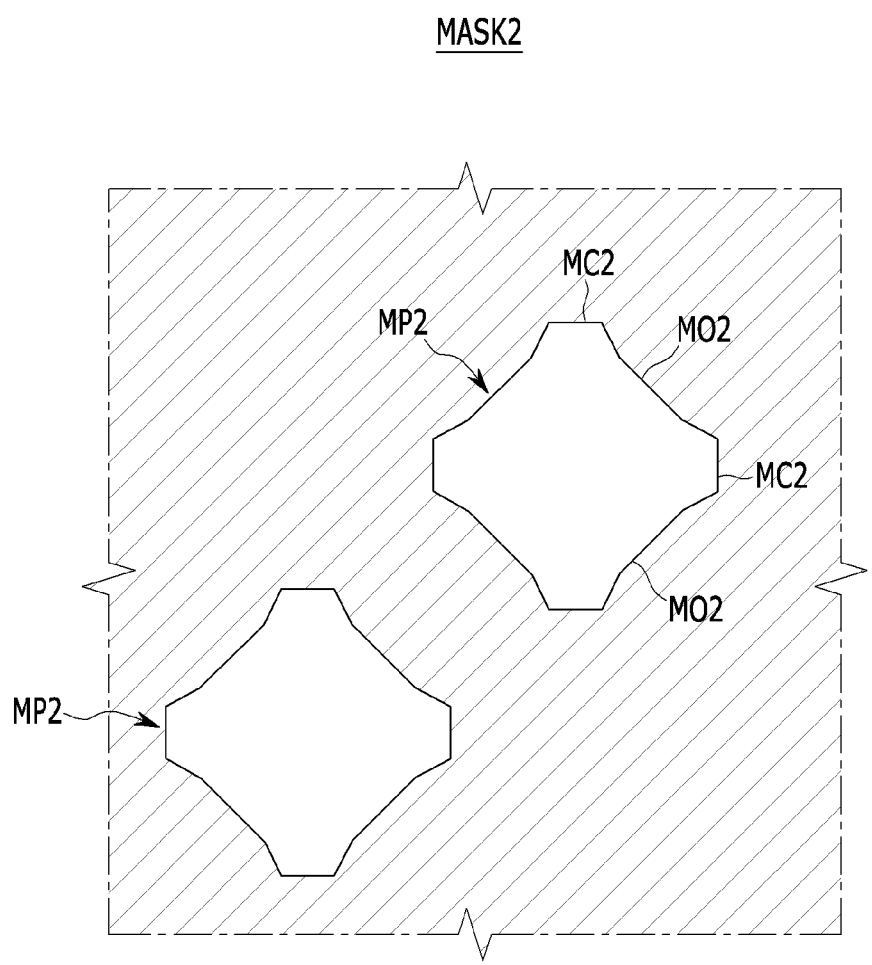
FIG. 5 is a diagram illustrating a partial plane of a second mask of the mask unit according to the second embodiment.
Figure 6:
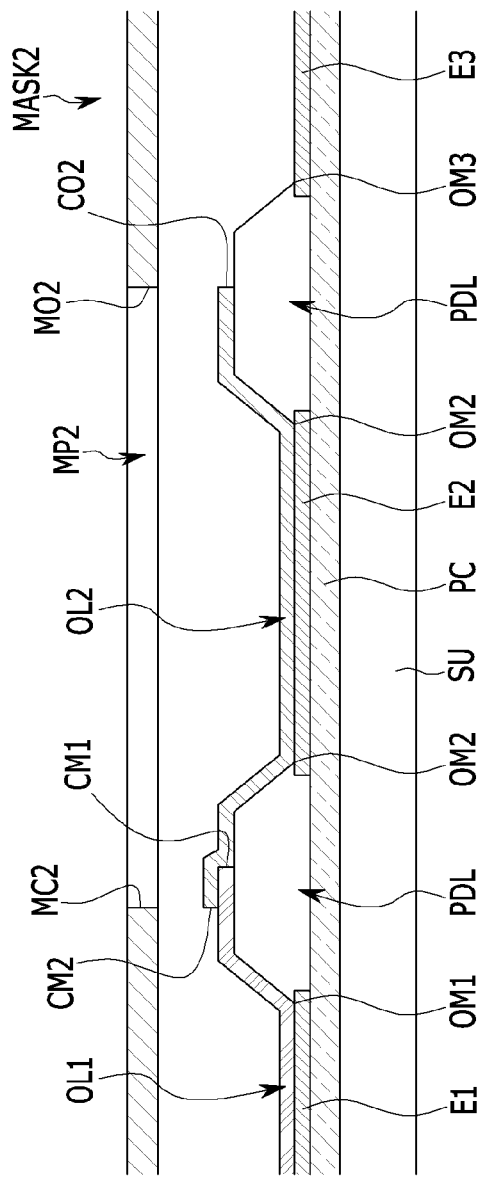
FIG. 6 is a diagram for describing formation of a second organic emission layer using the second mask illustrated in FIG. 5.

FIG. 5 is a diagram illustrating a partial plane of a second mask of the mask unit according to the second embodiment. FIG. 6 is a diagram for describing formation of a second organic emission layer using the second mask illustrated in FIG. 5.

As illustrated in FIGS. 5 and 6, a second mask MASK2 of the mask unit according to the second embodiment is used when depositing the second organic emission layer OL2 and includes a second mask pattern portion MP2. The second mask MASK2 is disposed on the pixel defining layer PDL during a depositing process for forming the second organic emission layer OL2.

The second mask pattern portion MP2 is positioned on the second electrode E2, disposed on the pixel defining layer PDL including the second opening OM2 having a second polygonal shape opening the second electrode E2, and used when the second organic emission layer OL2 is formed. The second mask pattern portion MP2 has a dotted shape, and is through-formed to correspond to the pixel defining layer PDL through the second electrode E2 corresponding to the second opening OM2. The second mask pattern portion MP2 includes a second mask chamfer MC2 corresponding to the corner of the second opening OM2.

The entire edge of the second mask pattern portion MP2 has a hexadecagonal shape corresponding to the entire shape of the second organic emission layer OL2, and includes four second mask chamfers MC2 which are spaced apart from each other and four second mask connection portions MO2 connecting ends of the second mask chamfers MC2. Each of the four second mask connection portions MO2 is curved twice and extended to connect the adjacent second mask chamfers MC2. Alternatively, the second mask connection portions MO2 are curved once or three times or more and extended or extended in a straight line to connect the adjacent second mask chamfers MC2.

The second mask chamfer MC2 of the second mask pattern portion MP2 is overlapped with the first chamfer CM1 of the first organic emission layer OL1 formed on the pixel defining layer PDL through the first mask pattern portion MP1 of the first mask MASK1.

The second organic emission layer OL2 is formed on the second electrode E2 through the second mask pattern portion MP2.

Figure 7:
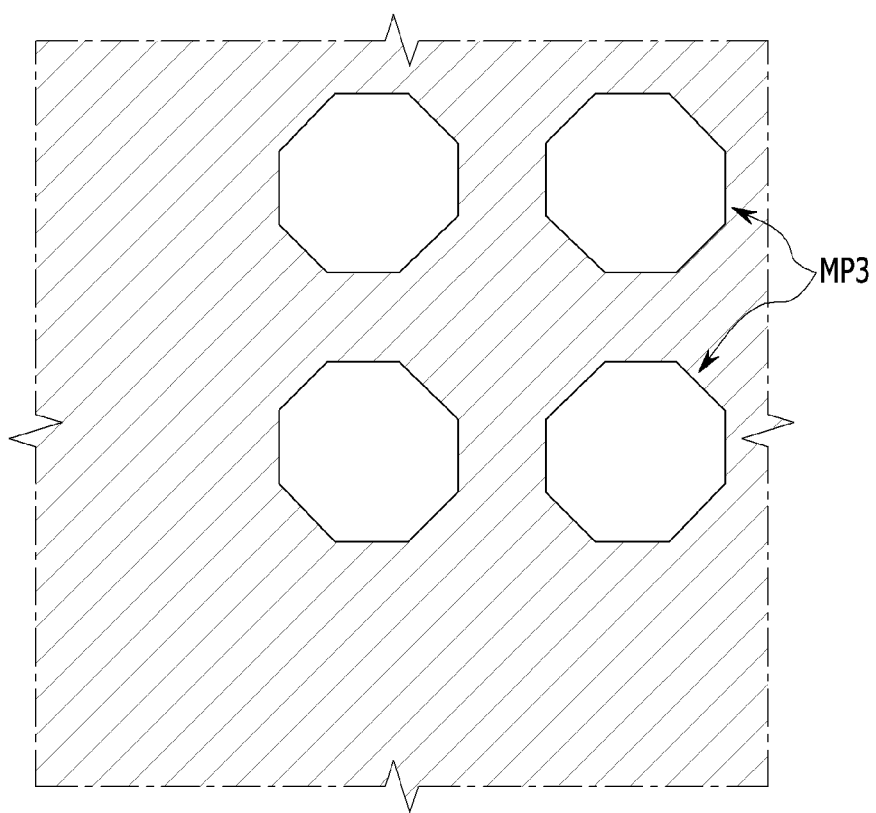
FIG. 7 is a diagram illustrating a partial plane of a third mask of the mask unit according to the second embodiment.
Figure 8:
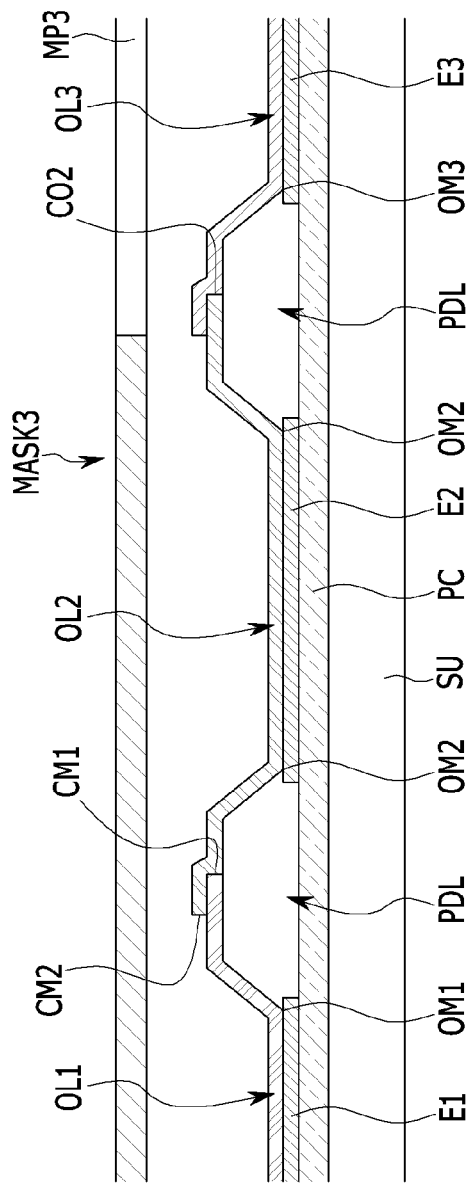
FIG. 8 is a diagram for describing formation of a third organic emission layer using the third mask illustrated in FIG. 7.

FIG. 7 is a diagram illustrating a partial plane of a third mask of the mask unit according to the second embodiment. FIG. 8 is a diagram for describing formation of a third organic emission layer using the third mask illustrated in FIG. 7.

As illustrated in FIGS. 7 and 8, a third mask MASK3 of the mask unit according to the second embodiment is used when depositing the third organic emission layer OL3 and includes a third mask pattern portion MP3. The third mask MASK3 is disposed on the pixel defining layer PDL during a depositing process for forming the third organic emission layer OL3.

The third mask pattern portion MP3 is positioned on the third electrode E3, disposed on the pixel defining layer PDL including the third opening OM3 having a third polygonal shape opening the third electrode E3, and used when the third organic emission layer OL3 is formed. The third mask pattern portion MP3 has a dotted shape, and is through-formed to correspond to the pixel defining layer PDL through the third electrode E3 corresponding to the third opening OM3. The third mask pattern portion MP3 is formed in a shape corresponding to the third opening OM3.

The entire edge of the third mask pattern portion MP3 has an octagonal shape to correspond to the entire shape of the third organic emission layer OL3.

A partial edge of the entire edge of the third mask pattern portion MP3 which is spaced apart from the first chamfer CM1 of the first organic emission layer OL1 formed on the pixel defining layer PDL through the first mask pattern portion MP1 and the second chamfer CM2 of the second organic emission layer OL2 formed on the pixel defining layer through the second mask pattern portion MP2 is overlapped with each edge of the first organic emission layer OL1 and the second organic emission layer OL2.

The third organic emission layer OL3 is formed on the third electrode E3 through the third mask pattern portion MP3.

As such, in the mask unit according to the second embodiment, even though the organic light emitting diode display according to the first embodiment is implemented at high resolution in a limited display area and thus even though the sizes of the first opening OM1, the second opening OM2, and the third opening OM3 become significantly reduced, the first mask pattern portion MP1, the second mask pattern portion MP2, and the third mask pattern portion MP3 of the first mask MASK1, the second mask MASK2, and the third mask MASK3 are expanded up to the top portion of the pixel defining layer PDL through the first opening OM1, the second opening OM2, and the third opening OM3 to be largely formed, and as a result, the first mask pattern portion MP1, the second mask pattern portion MP2, and the third mask pattern portion MP3 may be easily formed at the first mask MASK1, the second mask MASK2, and the third mask MASK3, respectively. That is, the mask unit including the first mask MASK1, the second mask MASK2, and the third mask MASK3 of which manufacturing yield is improved is provided.

Further, in the mask unit according to the second embodiment, even though the organic light emitting diode display according to the first embodiment is implemented at high resolution in a limited display area and thus distances between corners of the first opening OM1, the second opening OM2, and the third opening OM3 which are adjacent to each other are decreased, the first mask pattern portion MP1 and the second mask pattern portion MP2 include the first mask chamfer MC1 corresponding to the corner of the first opening OM1 and the second mask chamfer MC2 corresponding to the corner of the second opening OM2 and as a result, when the first organic emission layer OL1 and the second organic emission layer OL2 are deposited through the first mask pattern portion MP1 and the second mask pattern portion MP2, the first chamfer CM1 which is an outermost edge of the first organic emission layer OL1 is prevented from intruding into the second opening OM2 or the third opening OM3 and simultaneously, the second chamfer CM2 which is an outermost edge of the second organic emission layer OL2 is prevented from intruding into the first opening OM1 or the third opening OM3. That is, the mask unit, which prevents an undesired organic emission layer from being deposited in the first opening OM1, the second opening OM2, and the third opening OM3, is provided.

Figure 9:
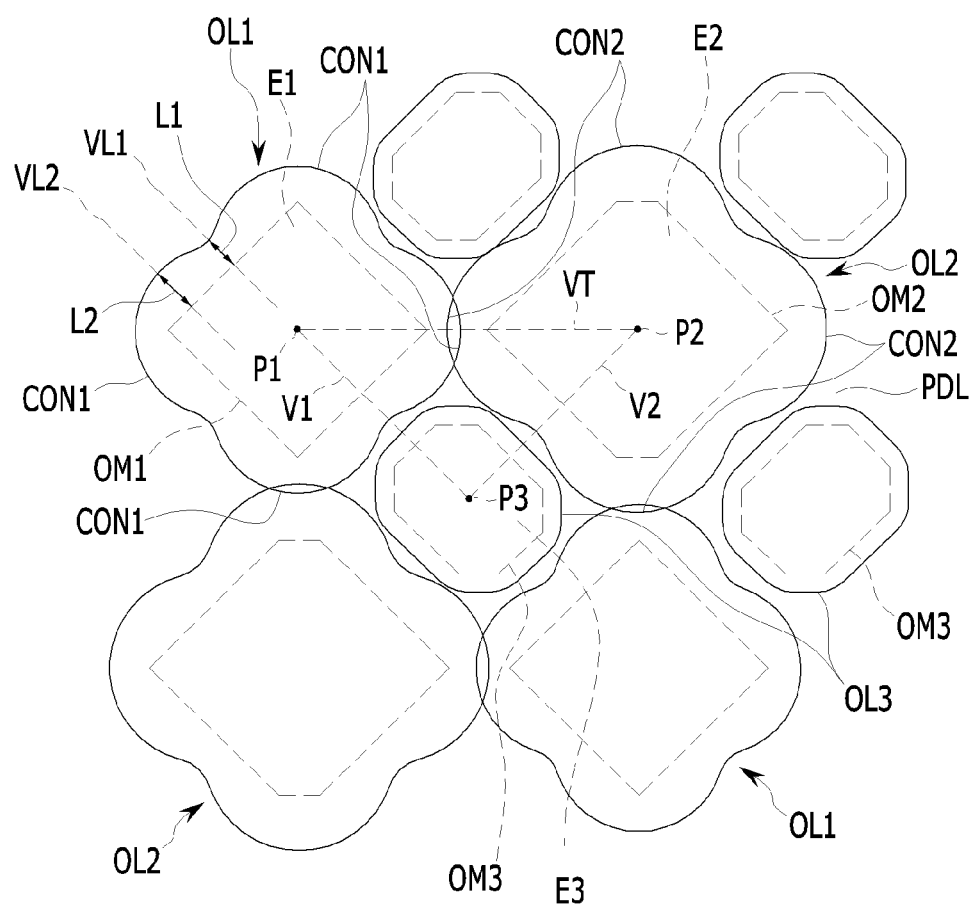
FIG. 9 is a diagram illustrating a partial plane of an organic light emitting diode display constructed as a third embodiment according to the principles of the present invention.

Hereinafter, an organic light emitting diode display according to a third embodiment will be described with reference to FIG. 9. FIG. 9 is a diagram illustrating a partial plane of an organic light emitting diode display according to a third embodiment.

Hereinafter, only features distinguished from those of the first embodiment are extracted and described, and portions of which the description is omitted follow the first embodiment.

The organic light emitting diode display according to the third embodiment may be an organic light emitting diode display which is manufactured by a process error generated when designing the organic light emitting diode display according to the first embodiment described above and manufacturing the designed organic light emitting diode display.

As illustrated in FIG. 9, an organic light emitting diode display according to the third embodiment includes a substrate, a circuit part, a first electrode E1, a second electrode E2, a third electrode E3, a pixel defining layer PDL, a first organic emission layer OL1, a second organic emission layer OL2, a third organic emission layer OL3, and a common electrode.

The first electrode E1 is positioned on the circuit part and connected with a thin film transistor of the circuit part. A central area of the first electrode E1 is positioned at a first vertex P1 of a virtual triangle VT. Here, the virtual triangle VT is an isosceles triangle in which central areas of the first electrode E1, the second electrode E2, and the third electrode E3 which are adjacent to each other are connected to each other. In detail, a length of a first side V1 connecting the first vertex P1 and a third vertex P3 of the virtual triangle VT is the same as a length of a second side V2 connecting the second vertex P2 and the third vertex P3.

The first electrode E1 may have various polygonal shapes, and the central area of the first electrode E1 is opened by a first opening OM1 of the pixel defining layer PDL.

The second electrode E2 is positioned on the circuit part, and spaced apart from the first electrode E1. The second electrode E2 is connected with a thin film transistor of the circuit part. A central area of the second electrode E2 is positioned at the second vertex P2 of the virtual triangle VT. The second electrode E2 may have various polygonal shapes, and the central area of the second electrode E2 is opened by a second opening OM2 of the pixel defining layer PDL.

The third electrode E3 is spaced apart from the first electrode E1 and the second electrode E2 and positioned on the circuit part. The third electrode E3 is connected with the thin film transistor (TFT) of the circuit part PC. A central area of the third electrode E3 is positioned at the third vertex P3 of the virtual triangle VT. The third electrode E3 may have various polygonal shapes, and the central area of the third electrode E3 is opened by a third opening OM3 of the pixel defining layer PDL.

The first electrode E1 and the second electrode E2 are disposed on a virtual square with the third electrode E3 as the center, and the first electrode E1 and the second electrode E2 surround the third electrode E3 with the third electrode E3 as the center. Each of the first electrode E1, the second electrode E2, and the third electrode E3 may be an anode functioning as a hole injection electrode or a cathode. The first electrode E1, the second electrode E2, and the third electrode E3 may be formed by light transmitting electrodes or light reflecting electrodes.

The pixel defining layer PDL is positioned on the first electrode E1, the second electrode E2, and the third electrode E3, respectively, and covers edges of the first electrode E1, the second electrode E2, and the third electrode E3. The pixel defining layer PDL includes the first opening OM1, the second opening OM2, and the third opening OM3.

The first opening OM1 opens the first electrode E1 and has a first polygonal shape which is a quadrangle. The first opening OM1 is spaced apart from the third opening OM3 and the second opening OM2, respectively, and a central point thereof is positioned at the first vertex P1 of the virtual triangle VT. The first opening OM1 has a larger area than the adjacent third opening OM3 and has a smaller area than the adjacent second opening OM2. The first opening OM1 has a quadrangular shape among the polygonal shapes, but is not limited thereto and may have polygonal shapes such as a triangle, a pentagon, a hexagon, a heptagon, and an octagon. A plurality of first openings OM1 is included, and the plurality of first openings OM1 has the same quadrangular shape. The plurality of first openings OM1 is spaced apart from each other with the third opening OM3 therebetween. The first organic emission layer OL1 emitting red light is positioned on the first electrode E1 opened by the first opening OM1. Alternatively, an organic emission layer emitting various colored light such as blue, green, or white may be positioned on the first electrode E1 opened by the first opening OM1.

The second opening OM2 opens the second electrode E2 and has a second polygonal shape which is a hexagon. The second opening OM2 is spaced apart from the first opening OM1 and the third opening OM3, respectively, and a central point thereof is positioned at the second vertex P2 of the virtual triangle VT. The second opening OM2 has a larger area than the adjacent third opening OM3 and the adjacent first opening OM1, respectively. The second opening OM2 has a hexagonal shape among the polygonal shapes, but is not limited thereto and may have polygonal shapes such as a triangle, a quadrangle, a pentagon, a heptagon, and an octagon. A plurality of second openings OM2 is included, and the plurality of second openings OM2 has the same hexagonal shape. The plurality of second openings OM2 is spaced apart from each other with the third opening OM3 therebetween. The second organic emission layer OL2 emitting blue light is positioned on the second electrode E2 opened by the second opening OM2. Alternatively, an organic emission layer emitting various colored light such as red, green, or white may be positioned on the second electrode E2 opened by the second opening OM2.

The third opening OM3 opens the third electrode E3 and has a third polygonal shape which is an octagon. The third opening OM3 is spaced apart from the first opening OM1 and the second opening OM2, respectively, and a central point thereof is positioned at the third vertex P3 of the virtual triangle VT. The third opening OM3 has a smaller area than the adjacent second opening OM2 and first opening OM1, respectively. The third opening OM3 has an octagonal shape among the polygonal shapes, but is not limited thereto and may have polygonal shapes such as a triangle, a quadrangle, a pentagon, a hexagon, and a heptagon. A plurality of third openings OM3 is included, and adjacent third openings OM3 among the plurality of third openings OM3 have octagonal shapes which are symmetrical to each other. Meanwhile, the plurality of third openings OM3 may have the same octagonal shape. The third organic emission layer OL3 emitting green light is positioned on the third electrode E3 opened by the third opening OM3. Alternatively, an organic emission layer emitting various colored light such as blue, red, or white may be positioned on the third electrode E3 opened by the third opening OM3.

Meanwhile, the center of the third opening OM3 is positioned at the central point of the virtual square, and centers of the first opening OM1 and the second opening OM2 surrounding the third opening OM3 along the virtual square may be positioned at adjacent vertexes of the virtual square, respectively.

The first organic emission layer OL1 is positioned on the pixel defining layer PDL through the first electrode E1 corresponding to the first opening OM1. The first organic emission layer OL1 includes a first convex portion CON1 adjacent to a corner of the first opening OM1 which is a quadrangle. The first convex portion CON1 intersects a straight line crossing the central point of the first opening OM1 and a vertex, for example, the corner, of the first opening OM1, wherein the vertex or the corner of the first opening OM1 is disposed between the first convex portion CON1 and the central point of the first opening OM1.

The entire edge of the first organic emission layer OL1 has a closed loop shape formed by curved lines, and is configured by four first convex portions CON1 which are connected to each other. A connection portion between the adjacent first convex portions CON1 is formed by a concave portion. The entire edge of the first organic emission layer OL1 includes the four first convex portions CON1, and as a result, a first distance L1 between one edge of the first opening OM1 disposed on a first virtual straight line VL1 traversing the first opening OM1 and one edge of the first organic emission layer OL1 is different from a second distance L2 between the other edge of the first opening OM1 disposed on a second virtual straight line VL2 which is parallel to the first straight line VL1 to traverse the first opening OM1 and the other edge of the first organic emission layer OL1. That is, the second distance L2 close to the first convex portion CON1 adjacent to the corner of the first opening OM1 is longer than the first distance L1.

The first organic emission layer OL1 includes an organic material emitting red light, and a portion which is positioned at the first opening OM1 and contacts the first electrode E1 emits red light. That is, the first organic emission layer OL1 has a quadrangular shape which is the first polygonal shape of the first opening OM1 and emits the red light.

Alternatively, the first organic emission layer OL1 may include an organic material emitting blue, green, or white light, and in this case, the portion which is positioned at the first opening OM1 and contacts the first electrode E1 emits blue, green, or white light.

The second organic emission layer OL2 is positioned on the pixel defining layer PDL through the second electrode E2 corresponding to the second opening OM2. The second organic emission layer OL2 includes a second convex portion CON2 adjacent to a corner of the second opening OM2 which is a hexagon.

The entire edge of the second organic emission layer OL2 has a closed loop shape formed by curved lines, and is configured by four second convex portions CON2 which are connected to each other. A connection portion between the adjacent second convex portions CON2 is formed by a concave portion. The second convex portion CON2 of the second organic emission layer OL2 is overlapped with the first convex portion CON1 of the first organic emission layer OL1 at a top portion of the pixel defining layer PDL. Even though the second convex portion CON2 of the second organic emission layer OL2 is overlapped with the first convex portion CON1 of the first organic emission layer OL1, since the first electrode E1 or the second electrode E2 is not positioned at the top portion of the pixel defining layer PDL, the first convex portion CON1 of the first organic emission layer OL1 and the second convex portion CON2 of the second organic emission layer OL2 which are the overlapped portions do not emit light.

The second organic emission layer OL2 includes an organic material emitting blue light, and a portion which is positioned at the second opening OM2 and contacts the second electrode E2 emits blue light. That is, the second organic emission layer OL2 has a hexagonal shape which is the second polygonal shape of the second opening OM2 and emits the blue light.

Alternatively, the second organic emission layer OL2 may include an organic material emitting red, green, or white light, and in this case, the portion which is positioned at the second opening OM2 and contacts the second electrode E2 emits red, green, or white light.

The third organic emission layer OL3 is positioned on the pixel defining layer PDL through the third electrode E3 corresponding to the third opening OM3. The entire edge of the third organic emission layer OL3 has a closed loop shape surrounding the third opening OM3 and is not overlapped with each edge of the first organic emission layer OL1 and the second organic emission layer OL2.

The third organic emission layer OL3 includes an organic material emitting green light, and a portion which is positioned at the third opening OM3 and contacts the third electrode E3 emits green light. That is, the third organic emission layer OL3 has an octagonal shape which is the third polygonal shape of the third opening OM3 and emits the green light.

Alternatively, the third organic emission layer OL3 may include an organic material emitting red, blue, or white light, and in this case, the portion which is positioned at the third opening OM3 and contacts the third electrode E3 emits red, blue, or white light.

Meanwhile, when the first organic emission layer OL1, the second organic emission layer OL2, and the third organic emission layer OL3 are formed, the opened first mask pattern portion, second mask pattern portion, and third mask pattern portion of the used first mask, second mask, and third mask may have the same shape as the first organic emission layer OL1, the second organic emission layer OL2, and the third organic emission layer OL3, respectively.

As such, the organic light emitting diode display according to the third embodiment is implemented at high resolution in a limited display area, and as a result, distances between the corners of the first opening OM1, the second opening OM2, and the third opening OM3 which are adjacent to each other are decreased and simultaneously, the first organic emission layer OL1 is formed to have a larger area than the first opening OM1. Accordingly, even though the first organic emission layer OL1 is positioned at the top portion of the pixel defining layer PDL, the first organic emission layer OL1 includes the first convex portion CON1 adjacent to the corner of the first opening OM1, and as a result, when the first organic emission layer OL1 is deposited, the first convex portion CON1 which is an outermost edge of the first organic emission layer OL1 is prevented from intruding into the second opening OM2 or the third opening OM3. That is, the organic light emitting diode display, which prevents colors of light emitted from the first opening OM1, the second opening OM2, the third opening OM3 from being mixed, is provided.

Further, the organic light emitting diode display according to the third embodiment is implemented at high resolution in a limited display area, and as a result, distances between the corners of the first opening OM1, the second opening OM2, and the third opening OM3 which are adjacent to each other are decreased and simultaneously, the second organic emission layer OL2 is formed to have a larger area than the second opening OM2. Accordingly, even though the second organic emission layer OL2 is positioned at the top portion of the pixel defining layer PDL and overlapped with the first convex portion CON1 of the first organic emission layer OL1, the second organic emission layer OL2 includes the second convex portion CON2 adjacent to the corner of the second opening OM2, and as a result, when the second organic emission layer OL2 is deposited, the second convex portion CON2 which is an outermost edge of the second organic emission layer OL2 is prevented from intruding into the first opening OM1 or the third opening OM3. That is, the organic light emitting diode display, which prevents colors of light emitted from the first opening OM1, the second opening OM2, and the third opening OM3 from being mixed, is provided.

As shown in FIGS. 1 and 9 and explained in the first and third embodiments of the present invention, the first organic emission layer OL1 covers the entire first opening OM1 and also covers a portion of the pixel defining layer PDL that forms the first opening OM1. Thus, an area of the first organic emission layer OL1 is greater than an area of the first opening OM1.

On the other hand, an outer shape of the first organic emission layer OL1 is geometrically dissimilar to the first polygon formed by the first opening OM1. For example, the outer shape of the first organic emission layer OL1 of the first embodiment shown in FIG. 1 has more edges than the first opening OM1 due to the first chamfers CM1 and the curved first connection portions CO1. For another example, the outer shape of the first organic emission layer OL1 of the third embodiment shown in FIG. 9 has the convex portions CON1 and the concave portions connecting the convex portions CON1. In contrast, the first opening OM1 has four straight edges.

Similarly, an area of the second organic emission layer OL2 is greater than an area of the second opening OM2, but on the other hand, an outer shape of the second organic emission layer OL2 is geometrically dissimilar to the second polygon formed by the second opening OM2.

According to the embodiment, it is possible to provide an organic light emitting diode display preventing colors of light emitted by one pixel from being mixed, even though the organic light emitting diode display is implemented at high resolution in a limited display area.

Further, according to the embodiment, it is possible to provide a mask unit improving manufacturing yield, even though the mask unit is used when a high resolution organic light emitting diode display is manufactured in a limited display area.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing an organic light emitting diode display, comprising:
   forming a first electrode on a substrate,
   forming a pixel defining layer on the first electrode, the pixel defining layer including a first opening overlapping the first electrode, and
   forming a first organic emission layer on the first electrode using a first mask,
   wherein:
   the first mask includes a first mask pattern portion which is through-formed to correspond to the pixel defining layer across the first electrode corresponding to the first opening and includes a first end portion corresponding to a corner of the first opening;
   an entire edge of the first mask pattern portion includes four of the first mask end portions which are spaced apart from each other and four first mask connection portions connecting ends of the first mask end portions;
   each of the four first mask connection portions includes at least two straight portions connected at a corner having an obtuse angle and extended between the ends of the first mask end portions; and
   each of the four first mask connection portions is arranged closer to a center of the first mask pattern portion than adjacent first mask end portions.

2. The method for manufacturing an organic light emitting diode display of claim 1, further comprising:
   forming a second electrode spaced apart from the first electrode on the substrate; and
   forming a second organic emission layer on the second electrode using a second mask,
   wherein:
   a central point of the first opening is positioned at a first vertex of a virtual triangle, and the pixel defining layer further includes a second opening which overlaps the second electrode and of which a central point is positioned at a second vertex of the virtual triangle; and
   the second mask includes a second mask pattern portion which is through-formed to correspond to the pixel defining layer across the second electrode corresponding to the second opening and includes a second end portion adjacent to a corner of the second opening.

3. The method for manufacturing an organic light emitting diode display of claim 2, wherein an entire edge of the second mask pattern portion includes four of the second mask end portions which are spaced apart from each other and four second mask connection portions connecting ends of the second mask end portions.

4. The method for manufacturing an organic light emitting diode display of claim 3, wherein each of the four second mask connection portions includes at least two straight portions connected at a corner having an obtuse angle and extended between the ends of the second mask end portions.

5. The method for manufacturing an organic light emitting diode display of claim 2, wherein a first end portion of the first organic emission layer formed on the pixel defining layer through the first mask pattern portion is overlapped with a second end portion of the second organic emission layer formed on the pixel defining layer through the second mask pattern portion.

6. The method for manufacturing an organic light emitting diode display of claim 2, further comprising:
forming a third electrode spaced apart from the first electrode and the second electrode on the substrate; and
forming a third organic emission layer on the third electrode using a third mask,
wherein:
the pixel defining layer further includes a third opening which overlaps the third electrode and of which a central point is positioned at a third vertex of the virtual triangle; and
the third mask includes a third mask pattern portion through-formed to correspond to the pixel defining layer across the third electrode corresponding to the third opening.

7. The method for manufacturing an organic light emitting diode display of claim 6, wherein a part of an entire edge of the third organic emission layer which is spaced apart from a first end portion of the first organic emission layer formed on the pixel defining layer through the first mask pattern portion and the second end portion of the second organic emission layer formed on the pixel defining layer through the second mask pattern portion is overlapped with the edge of ends of the first organic emission layer and the second organic emission layer.

8. A system of a mask unit and a substrate comprising:
the mask unit disposed on the substrate, including a first mask; and
the substrate including:
a first electrode; and
a pixel defining layer positioned on the first electrode, the pixel defining layer including a first opening overlapping the first electrode,
wherein:
the first mask includes a first mask pattern portion which is through-formed to correspond to the pixel defining layer across the first electrode corresponding to the first opening, the first mask pattern portion including a first mask end portion corresponding to a corner of the first opening;
an entire edge of the first mask pattern portion includes four of the first mask end portions spaced apart from each other, and four first mask connection portions connecting ends of the first mask end portions;
each of the four first mask connection portions includes at least two straight portions connected at a corner with having obtuse angle and extended between the ends of the first mask end portions; and
each of the four first mask connection portions is arranged closer to a center of the first mask pattern portion than adjacent first mask end portions.

9. The system of the mask unit and the substrate of claim 8, further comprising a central point of the first opening being positioned at a first vertex of a virtual triangle,
wherein:
the substrate further includes a second electrode spaced apart from the first electrode;
the pixel defining layer further includes a second opening overlapping the second electrode;
a central point of the second opening is positioned at a second vertex of the virtual triangle; and
the mask unit further includes a second mask including a second mask pattern portion which is through-formed to correspond to the pixel defining layer across the second electrode corresponding to the second opening, the second mask pattern portion including a second end portion adjacent to a corner of the second opening.

10. The system of the mask unit and the substrate of claim 9, wherein an entire edge of the second mask pattern portion includes four second mask end portions spaced apart from each other, and four second mask connection portions connecting ends of the second mask end portions.

11. The system of the mask unit and the substrate of claim 10, wherein each of the four second mask connection portions includes at least two straight portions connected at a corner having an obtuse angle and extended between the ends of the second mask end portions.

12. The system of the mask unit and the substrate of claim 9, wherein a first end portion of a first organic emission layer formed on the pixel defining layer across the first mask pattern portion is overlapped with a second end portion of a second organic emission layer formed on the pixel defining layer through the second mask pattern portion.

13. The system of the mask unit and the substrate of claim 9, wherein:
the substrate further includes a third electrode spaced apart from the first electrode and the second electrode;
the pixel defining layer further includes a third opening overlapping the third electrode and a central point of the third opening is positioned at a third vertex of the virtual triangle; and
the mask unit further includes a third mask including a third mask pattern portion which is through-formed to correspond to the pixel defining layer across the third electrode corresponding to the third opening.

14. The system of the mask unit and the substrate of claim 13, wherein an entire edge of the third mask pattern portion has an octagonal shape.

15. The system of the mask unit and the substrate of claim 13, wherein a part of an entire edge of a third organic emission layer which is spaced apart from a first end portion of a first organic emission layer formed on the pixel defining layer through the first mask pattern portion and a second end portion of a second organic emission layer formed on the pixel defining layer across the second mask pattern portion is overlapped with the edge of each of the first organic emission layer and the second organic emission layer.

16. The system of the mask unit and the substrate of claim 8, wherein
a corner of the first opening is disposed between the first mask end portion and a central point of the first opening in a plan view.

* * * * *